United States Patent
An et al.

(10) Patent No.: US 7,764,121 B2
(45) Date of Patent: Jul. 27, 2010

(54) DIFFERENTIAL AMPLIFIER, METHOD FOR AMPLIFYING SIGNALS OF DIFFERENTIAL AMPLIFIER, AND DISPLAY DRIVING DEVICE HAVING DIFFERENTIAL AMPLIFIER

(75) Inventors: Chang Ho An, Hwaseong-si (KR); Kye Eon Chang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 81 days.

(21) Appl. No.: 12/217,933

(22) Filed: Jul. 10, 2008

(65) Prior Publication Data
US 2009/0039959 A1  Feb. 12, 2009

(30) Foreign Application Priority Data
Aug. 8, 2007  (KR) .................... 10-2007-0079424

(51) Int. Cl.
*H03F 3/45* (2006.01)
(52) U.S. Cl. ...................... 330/255; 330/253
(58) Field of Classification Search ............... 330/255, 330/253
See application file for complete search history.

(56) References Cited

U.S. PATENT DOCUMENTS 6,542,033 B2 *  4/2003  Maejima .................... 330/261

2006/0232577 A1  10/2006  Edwards et al.

FOREIGN PATENT DOCUMENTS

| JP | 2000-172231 | 6/2000 |
| KR | 10-2004-0070513 | 8/2004 |
| KR | 10-2005-0039427 | 4/2005 |
| KR | 10-2006-0065671 | 6/2006 |

* cited by examiner

*Primary Examiner*—Robert Pascal
*Assistant Examiner*—Khiem D Nguyen
(74) *Attorney, Agent, or Firm*—Mills & Onello, LLP

(57) ABSTRACT

A differential amplifier includes input, output, current summing, and switch circuits. The input circuit generates first and second differential currents in response to a voltage difference between differential input signals. The output circuit includes a first and second transistors connected between a first voltage rail and output port and the output port and second voltage rail, respectively. The current summing circuit includes a first control node outputting a first control voltage to control a current in the first transistor and a second control node outputting a second control voltage to control a current in the second transistor, in response to the first and second differential currents, respectively. The switch circuit connects the first transistor gate to one of the first control node and the first voltage rail and the second transistor gate to one of the second control node and the second voltage rail, in response to a control signal.

9 Claims, 3 Drawing Sheets

DIFFERENTIAL AMPLIFIER, METHOD FOR AMPLIFYING SIGNALS OF DIFFERENTIAL AMPLIFIER, AND DISPLAY DRIVING DEVICE HAVING DIFFERENTIAL AMPLIFIER

CROSS-REFERENCE TO RELATED PATENT APPLICATIONS

This application claims the benefit of priority to Korean Patent Application No. 10-2007-0079424, filed on Aug. 8, 2007, in the Korean Intellectual Property Office, the disclosure of which is incorporated herein in its entirety by reference.

BACKGROUND OF THE INVENTION

1. Field of the Invention

The present invention relates to a semiconductor device, and more particularly, to a differential amplifier, a method for amplifying signals of the differential amplifier, and a display driving device having the differential amplifier.

2. Description of Related Art

A display driving device, which is referred to as a source driver or a data line driver, is used to drive a flat panel display device, such as a liquid crystal display (LCD). FIG. 1 is a circuit diagram showing an output portion of a general display driving device. Referring to FIG. 1, an output portion 10 of a display driving device includes a digital-to-analog converter (DAC) 11, a plurality of buffers 13-1, 13-2, 13-3, . . . , 13-n, where "n" is a natural number, a bias voltage generator 15, a plurality of first transmission switches 17-1, 17-2, 17-3, . . . , 17-n, and a plurality of second transmission switches 19-1, 19-2, 19-3, . . . , 19-n. The DAC 11 converts input digital image data DATA to analog signals inp1, inp2, inp3, . . . , inpn.

Each of the buffers 13-1, 13-2, 13-3, . . . , 13-n receives and amplifies a corresponding one of the analog signals inp1, inp2, inp3, . . . , inpn output from the DAC 11. Each of the buffers 13-1, 13-2, 13-3, . . . , 13-n can be embodied by an operational amplifier, for example, a rail-to-rail differential operational amplifier or a unit gain buffer, each of which is known in the art.

The bias voltage generator 15 supplies bias control voltages to each of the buffers 13-1, 13-2, 13-3, . . . , 13-n so that each buffer can normally perform an amplification operation. During the amplification operation, for example, when a control signal SW has a high level and a complementary control signal SWB has a low level, each of the first transmission switches 17-1, 17-2, 17-3, . . . , 17-n, in response to the control signals SW and SWB, supplies a voltage amplified by each of the buffers 13-1, 13-2, 13-3, . . . , 13-n to each of a plurality of data lines Y1, Y2, Y3, . . . , Yn. Each of the second transmission switches 19-1, 19-2, 19-3, . . . , 19-n maintains an off state in response to a plurality of charge sharing control signals CS_SW and CS_SWB.

During the charge sharing operation, for example, when the charge sharing control signal CS_SW has a high level and the complementary charge sharing control signal CS_SWB has a low level, each of the second transmission switches 19-1, 19-2, 19-3, . . . , 19-n is connected to a corresponding one of the plurality of data lines Y1, Y2, Y3, . . . , Yn, in response to the charge sharing control signals CS_SW and CS_SWB. Each of the first transmission switches 17-1, 17-2, 17-3, . . . , 17-n maintains an off state in response to the control signals SW and SWB.

Since each of the buffers 13-1, 13-2, 13-3, . . . , 13-n includes an operational amplifier consuming a large amount of power, most of the power consumed by the display driving device is consumed at the output portion 10. Thus, a display driving device having an improved structure that can reduce power dissipation generated in the output portion 10 is needed. Also, a buffer having an improved structure is needed.

Furthermore, since the display driving device includes the first transmission switches 17-1, 17-2, 17-3, . . . , 17-n, a layout area of the display driving device increases. Thus, as the number of data lines that the display driving device drives increases, the number of the first transmission switches 17-1, 17-2, 17-3, . . . , 17-n increases. Thus, a display driving device having an improved structure that reduces the layout area is needed.

SUMMARY OF THE INVENTION

To solve the above and/or other problems, a display driving device is provided that can reduce power dissipation and a layout area.

An operational amplifier is also provided that can be embodied in the display driving device to reduce power dissipation and a layout area.

According to an aspect of the present invention, a differential amplifier comprises an input circuit configured to generate first differential currents and second differential currents in response to a voltage difference between differential input signals, an output circuit including a first transistor connected between a first voltage rail and an output port and a second transistor connected between the output port and a second voltage rail, a current summing circuit including a first control node configured to output a first control voltage to control a current flowing in the first transistor in response to the first differential currents and a second control node configured to output a second control voltage to control a current flowing in the second transistor in response to the second differential currents, and a switch circuit connecting a gate of the first transistor to one of the first control node and the first voltage rail and a gate of the second transistor to one of the second control node and the second voltage rail, in response to a control signal.

The switch circuit can comprise a first switch configured to control a connection between the first control node and the gate of the first transistor in response to the control signal, a second switch configured to control a connection between the second control node and the gate of the second transistor in response to the control signal, a third switch configured to control a connection between the first voltage rail and the gate of the first transistor in response to the control signal, and a fourth switch configured to control a connection between the second voltage rail and the gate of the second transistor in response to the control signal.

Each of the first and second switches can be a transmission gate.

The third switch can be a PMOSFET and the fourth switch can an NMOSFET.

In response to the control signal, the switch circuit can connect between the gate of the first transistor and the first control node and between the gate of the second transistor and the second control node, during an amplification operation, and connect between the gate of the first transistor and the first voltage rail and between the gate of the second transistor and the second voltage rail, during a charge sharing operation, in response to the control signal.

The current summing circuit can comprise a first cascode current mirror connected between the first voltage rail and the first control node, and a second cascode current mirror connected between the second voltage rail and the second control node.

The differential amplifier can further comprise a first compensation capacitor connected between the output node of the output circuit and a first node of the first cascade current mirror to which one of the first differential currents is supplied, and a second compensation capacitor connected between the output node of the output circuit and a second node of the second cascade current mirror to which one of the second differential currents is supplied.

The differential amplifier can further comprise a bias circuit that is connected between the first and second control nodes and configured to determine a static current of each of the first and second transistors.

According to another aspect of the present invention, a display driving circuit comprises a plurality of unit gain amplifiers, and a plurality of charge sharing switches, each of the charge sharing switches is configured to control a connection between the unit gain amplifiers and output ports in response to a charge sharing control signal, wherein each of the unit gain amplifiers comprises an input circuit including a first differential amplifier configured to generate first differential currents corresponding to a voltage difference between input signals and a second differential amplifier configured to generate second differential currents corresponding to the voltage difference, an output circuit including a first transistor connected between a first voltage rail and an output port thereof and a second transistor connected between the output port and a second voltage rail, a current summing circuit including a first control node configured to output a first control voltage to control a current flowing in the first transistor in response to the first output currents and a second control node configured to output a second control voltage to control a current flowing in the second transistor in response to the second output currents, and a switch circuit configured to connect a gate of the first transistor to one of the first control node and the first voltage rail and a gate of the second transistor to one of the second control node and the second voltage rail, in response to a control signal.

The switch circuit can comprise a first switch configured to control a connection between the first control node and the gate of the first transistor in response to the control signal, a second switch configured to control a connection between the second control node and the gate of the second transistor in response to the control signal, a third switch configured to control a connection between the first voltage rail and the gate of the first transistor in response to the control signal, and a fourth switch configured to control a connection between the second voltage rail and the gate of the second transistor in response to the control signal.

In response to the control signal, the switch circuit can be configured to connect between the gate of the first transistor and the first control node and between the gate of the second transistor and the second control node, during an amplification operation, and connect between the gate of the first transistor and the first voltage rail and between the gate of the second transistor and the second voltage rail, during a charge sharing operation.

According to another aspect of the present invention, a method for amplifying a signal of a differential amplifier comprises generating first currents and second currents in response to a voltage difference between input signals, outputting to a first control node a first control voltage to control a current flowing in a first transistor of a class AB output circuit connected between a first voltage rail and an output port in response to the first currents and outputting to a second control node a second control voltage to control a current flowing in a second transistor of the class AB output circuit connected between the output port and a second voltage rail in response to the second currents, and connecting the first control node and the second control node respectively to a gate of the first transistor and a gate of the second transistor or the first voltage rail and the second voltage rail respectively to the gate of the first transistor and the gate of the second transistor, in response to a control signal.

In the connecting of the first control node and the second control node, respectively, to a gate of the first transistor and a gate of the second transistor or the first voltage rail and the second voltage rail, respectively, to the gate of the first transistor and the gate of the second transistor, in response to a control signal, the gate of the first transistor and the first control node, and the gate of the second transistor and the second control node, are connected during an amplification operation, in response to the control signal, and the gate of the first transistor and the first voltage rail, and the gate of the second transistor and the second voltage rail, are connected during a charge sharing operation, in response to the control signal.

BRIEF DESCRIPTION OF THE DRAWINGS

The above and other features and advantages of the present invention will become more apparent by describing in detail preferred embodiments with reference to the attached drawings, in which.

DETAILED DESCRIPTION OF PREFERRED EMBODIMENTS

Hereinafter, aspects of the present invention will be described by explaining illustrative embodiments in accordance therewith, with reference to the attached drawings. While describing these embodiments, detailed descriptions of well-known items, functions, or configurations are typically omitted for conciseness.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

Figure 2:
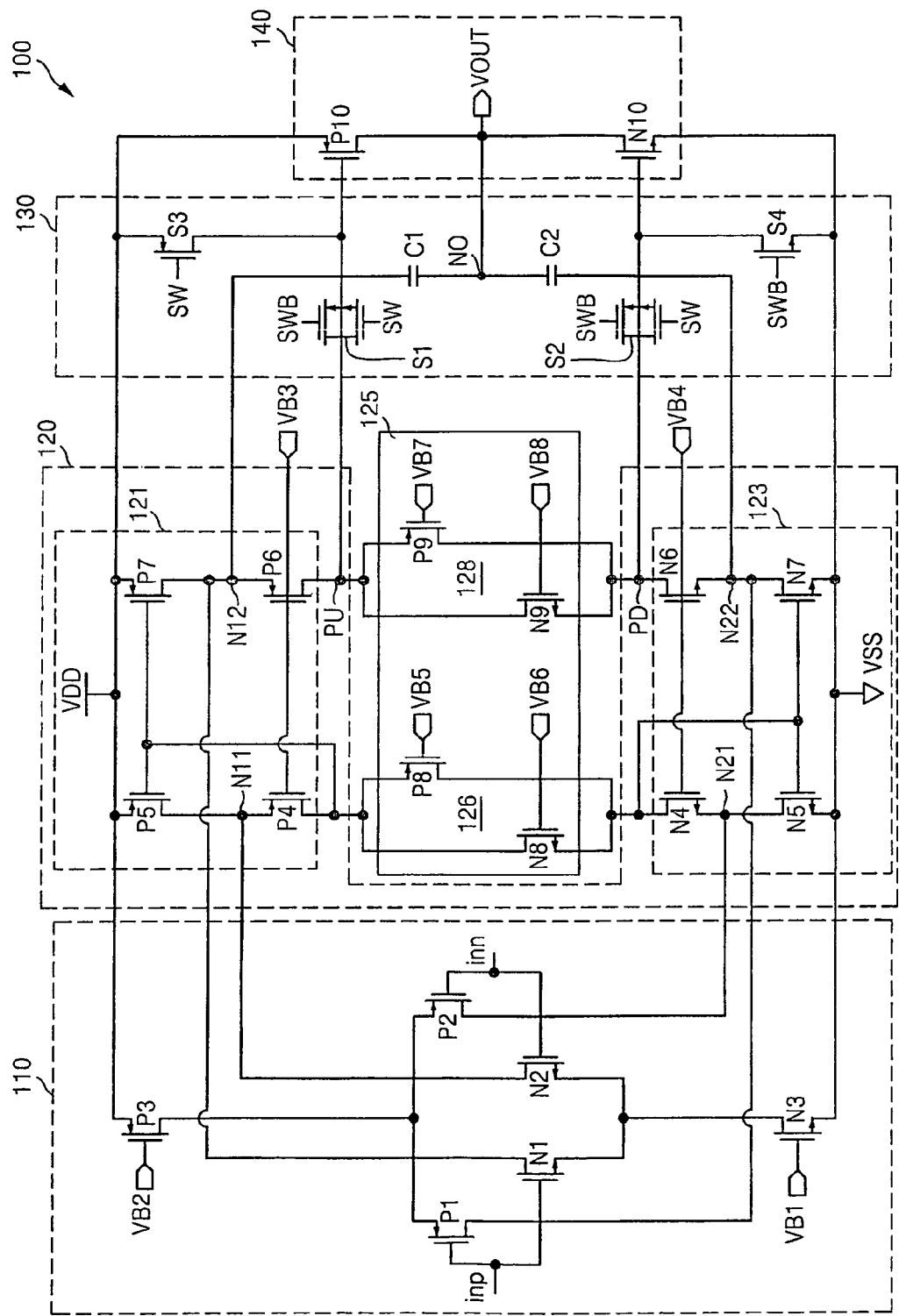
FIG. 2 is a circuit diagram of an embodiment of a differential amplifier according to aspects of the present invention.

FIG. 2 is a circuit diagram of an embodiment of a differential amplifier 100 according to aspects of the present invention. Referring to FIG. 2, the differential amplifier (or operational amplifier) 100 includes an input circuit 110, a current summing circuit 120, a bias circuit 125, a switch circuit 130, and an output circuit 140. The differential amplifier 100 is a rail-to-rail differential amplifier. The input circuit 110, referred to as an input stage, includes a first differential amplifier (N1, N2, and N3) and a second differential amplifier (P1, P2, and P3).

The first differential amplifier includes a pair of NMOS-FETs (N-channel metal oxide semiconductor field effect transistors) N1 and N2 connected to a second voltage rail via a third NMOSFET N3. The NMOSFET pair N1 and N2 has a common source configuration. The third NMOSFET N3 functions as a current source and controls the amount of a bias current supplied to the first differential amplifier in response to a first bias control voltage VB1. Each drain of the NMOS-FET pair N1 and N2 is respectively connected to nodes N12 and N11 of a first current mirror 121.

The second differential amplifier includes a pair of PMOS-FETs (P-channel metal oxide semiconductor field effect transistors) P1 and P2 connected to a first voltage rail via a third PMOSFET P3. The PMOSFET pair P1 and P2 has a common source configuration. The third PMOSFET P3 functions as a current source and controls the amount of a bias current supplied to the second differential amplifier in response to a second bias control voltage VB2. Each drain of the PMOS-FET pair P1 and P2 is respectively connected to nodes N22 and N21 of a second current mirror 123.

The first voltage rail supplies a first voltage VDD and the second voltage rail supplies a second voltage VSS that is lower than the first voltage VDD, for example, a ground voltage. The first differential amplifier generates first differential currents in response to a voltage difference between differential input signals inp and inn. The second differential amplifier generates second differential currents in response to a voltage difference between the differential input signals inp and inn.

The input circuit 110 is a folded cascode operational transconductance amplifier (OTA). The folded cascode OTA converts the voltage difference between the differential input signals inp and inn to differential currents to determine an output voltage VOUT of an output node NO. The current summing circuit 120 includes the first current mirror 121 and the second current mirror 123. Each of the first and second current mirrors 121 and 123 may be implemented as a cascode current mirror.

The first cascode current mirror 121 is connected between the first voltage rail and the bias circuit 125. The first cascode current mirror 121 includes a plurality of PMOSFETs P4, P5, P6, and P7. The PMOSFETs P4 and P6 constitute a common gate amplifier. The first cascode current mirror 121 outputs to a first control node PU a first control voltage to control a current flowing in a first transistor P10 of the output circuit 140, in response to at least one of the first differential currents or a third bias control voltage VB3. The first transistor P10 may be a PMOSFET.

The second cascode current mirror 123 is connected between the bias circuit 125 and the second voltage rail. The second cascode current mirror 123 includes a plurality of NMOSFETs N4, N5, N6, and N7. The NMOSFETs N4 and N6 constitute a common gate amplifier. The second cascode current mirror 123 outputs a second control voltage to control a current flowing in a second transistor N10 of the output circuit 140, to a second control node PD, in response to at least one of the second differential currents or a fourth bias control voltage VB4. The second transistor N10 may be an NMOSFET.

The bias circuit 125 includes a first bias circuit 126 that is referred to as a floating current source and a second bias circuit 128 that is referred to as a floating class AB control. The first bias circuit 126 connected between the first cascode current mirror 121 and the second cascode current mirror 123 is controlled in response to a fifth bias control voltage VB5 and a sixth bias control voltage VB6.

The second bias circuit 128 connected between the first control node PU and the second control node PD controls the amount of current, for example, a static current or a quiescent current, flowing in the output circuit 140, in response to a seventh bias control voltage VB7 and an eighth bias control voltage VB8, so that the output circuit 140 may operate as a class AB amplifier output stage circuit.

The input circuit 110 and the current summing circuit 120 control the level of the current flowing in the output circuit 140. That is, the input circuit 110 generates the first differential currents and the second differential currents in response to the voltage difference between the differential input signals inp and inn. The first differential currents and the second differential currents are transmitted to the current summing circuit 120. The current summing circuit 120 controls the voltage levels of the first and second control nodes PU and PD using the first and second cascode current mirrors 121 and 123.

Also, the current summing circuit 120 and the bias circuit 125 constitute a control unit of the differential amplifier 100. The control unit controls an amount of a current flowing through the output circuit 140 in response to the differential currents generated by the input circuit 110, for example, the first differential currents and the second differential currents.

Figure 3:
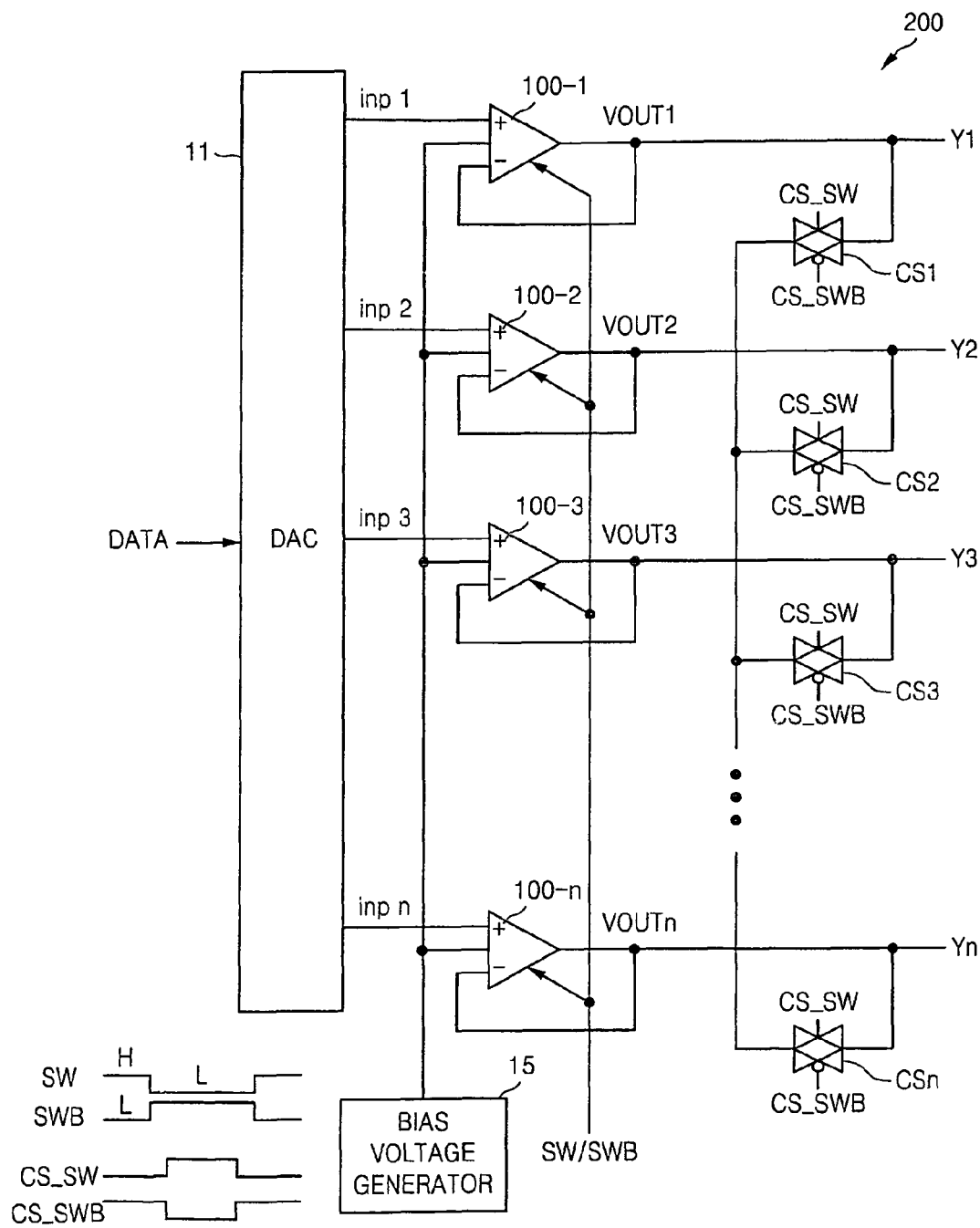
FIG. 3 is a circuit diagram showing an embodiment of an output portion of a display driving device that incorporates the differential amplifier of FIG. 2.

The switch circuit 130, in response to at least one of a control signal SW and a complementary control signal SWB that is complementary to the control signal SW shown in FIG. 3, connects a gate of the first transistor P10 of the output circuit 140 to either the first control node PU or the first voltage rail, and a gate of the second transistor N10 of the output circuit 140 to either the second control node PD or the second voltage rail.

The switch circuit 130 includes a plurality of switches S1 to S4. The first switch S1, in response to the control signal SW and the complementary control signal SWB, controls the connection between the first control node PU and the gate of the first transistor P10. The second switch S2, in response to the control signal SW and the complementary control signal SWB, controls the connection between the second control node PD and the gate of the second transistor N10. The third switch S3, in response to the control signal SW, controls the connection between the first voltage rail and the gate of the first transistor P10. The fourth switch S4, in response to the complementary control signal SWB, controls the connection between the second voltage rail and the gate of the second transistor N10.

In the present embodiment, each of the first and second switches S1 and S2 is implemented as a transmission gate and the third switch S3 and the fourth switch S4 are respectively implemented as a PMOSFET and an NMOSFET. However, each of the first and second switches S1 and S2 may be implemented as an NMOSFET or a PMOSFET.

During the amplification operation, in response to the control signal SW having a first level, for example, a high level H, and the complementary control signal SWB having a second level, for example, a low level L, the first switch S1 connects the gate of the first transistor P10 and the first control node PU, the second switch S2 connects the gate of the second transistor N10 and the second control node PD, the third switch S3 disconnects the first voltage rail and the gate of the first transistor P10, and the fourth switch S4 disconnects the second voltage rail and the gate of the second transistor N10.

However, during the charge sharing operation, in response to the control signal SW having a second level, for example, a low level L, and the complementary control signal SWB having a first level, for example, a high level H, the first switch S1 disconnects the gate of the first transistor P10 and the first control node PU; the second switch S2 disconnects the gate of the second transistor N10 and the second control node PD; the third switch S3 connects the first voltage rail and the gate of the first transistor P10; and the fourth switch S4 connects the second voltage rail and the gate of the second transistor N10. Thus, as the first transistor P10 and the second transistor N10 are turned on, the output voltage VOUT of the output circuit 140 of the differential amplifier 100 becomes about a half of the first voltage VDD (0.5VDD) and the second voltage VSS.

A first compensation capacitor C1 is connected between the output node NO and the node N12 of the first cascode current mirror 121. A second compensation capacitor C2 is connected between the output node NO and the node N22 of the second cascode current mirror 123. However, the differential amplifier 100, according to the present embodiment, may be implemented without the first and second compensation capacitors C1 and C2.

The output circuit (or output stage) 140 having the first and second transistors P10 and N10 having a common source structure is connected between the first and second voltage rails. During the amplification operation, the bias current of the first transistor P10 is determined according to the first control voltage, that is, the voltage of the first control node PU, supplied to the gate of the first transistor P10. The bias current of the second transistor N10 is determined according to the second control voltage, that is, the voltage of the second control node PD, supplied to the gate of the second transistor N10. Thus, the differential amplifier 100 according to the present embodiment may perform a function of a class AB rail-to-rail operational amplifier.

FIG. 3 is a circuit diagram showing an embodiment of an output portion of a display driving device having the differential amplifier of FIG. 2. Referring to FIG. 3, a display driving device according to the present embodiment can drive flat panel displays, such as TFT LCDs, PDP displays, or OLED (organic light emitting device) displays, as examples. An output unit 200 of the display driving device that is referred to as a source driver or a data line driver includes a digital-to-analog converter (DAC) 11, a bias voltage generator 15, a plurality of buffers 100-1, 100-2, 100-3, . . . , and 100-$n$, where "n" is a natural number, and a plurality of switches CS1, CS2, CS3, . . . , CSn.

The structure of each of the buffers 100-1, 100-2, 100-3, . . . , and 100-$n$ is substantially the same as that of the differential amplifier 100 shown in FIG. 2. However, for each of the buffers 100-1, 100-2, 100-3, . . . , and 100-$n$ to perform a function as a unit gain buffer, an output voltage VOUT1-VOUTn, where "n" is a natural number, is feedback to a negative input port (−), that is, a port to which the voltage inn is input. The complementary control signal SWB generated by using at least a part of the control signal SW and the control signal SW is input to each of the buffers 100-1, 100-2, 100-3, . . . , and 100-$n$.

A corresponding one of the switches CS1, CS2, CS3, . . . , CSn is arranged between two corresponding buffers, for example, the switches 100-1 and 100-2 or the switches 100-2 and 100-3, of the buffers 100-1, 100-2, 100-3, . . . , and 100-$n$. Each of the switches CS1, CS2, CS3, . . . , CSn is turned on/off in response to a charge sharing control signal CS_SW and a complementary charge sharing signal CS_SWB. Each of the switches CS1, CS2, CS3, . . . , CSn may be embodied by a transmission gate. The charge sharing control signals CS_SW and CS_SWB are complementary signals or differential signals.

The control signal SW and the charge sharing control signal CS_SW has a non-overlap section. During the charge sharing operation, for example, when the complementary control signal SWB and the charge sharing control signal CS_SW have a high level H and the control signal SW and the complementary charge sharing control signal CS_SWB have a low level L, the output ports of the buffers 100-1, 100-2, 100-3, . . . , and 100-$n$ are connected to one another. Thus, charge sharing occurs between the output ports of the buffers 100-1, 100-2, 100-3, . . . , and 100-$n$.

In this case, in each of the buffers 100-1, 100-2, 100-3, . . . , and 100-$n$, the first and second switches S1 and S2 are turned off and the third and fourth switches S3 and S4 are turned on (please refer to FIG. 2). During the amplification operation, for example, when the complementary control signal SWB and the charge sharing control signal CS_SW have a low level L and the control signal SW and the complementary charge sharing control signal CS_SWB have a high level H, each of the output ports of the buffers 100-1, 100-2, 100-3, . . . , and 100-$n$ is disconnected to each other.

In this case, in each of the buffers 100-1, 100-2, 100-3, . . . , and 100-$n$, the first and second switches S1 and S2 are turned on and the third and fourth switches S3 and S4 are turned off (please refer to FIG. 2). Thus, a voltage amplified or buffered by each of the buffers 100-1, 100-2, 100-3, . . . , and 100-$n$ is supplied to a plurality of data lines Y1, Y2, Y3, . . . , Yn.

Figure 1:
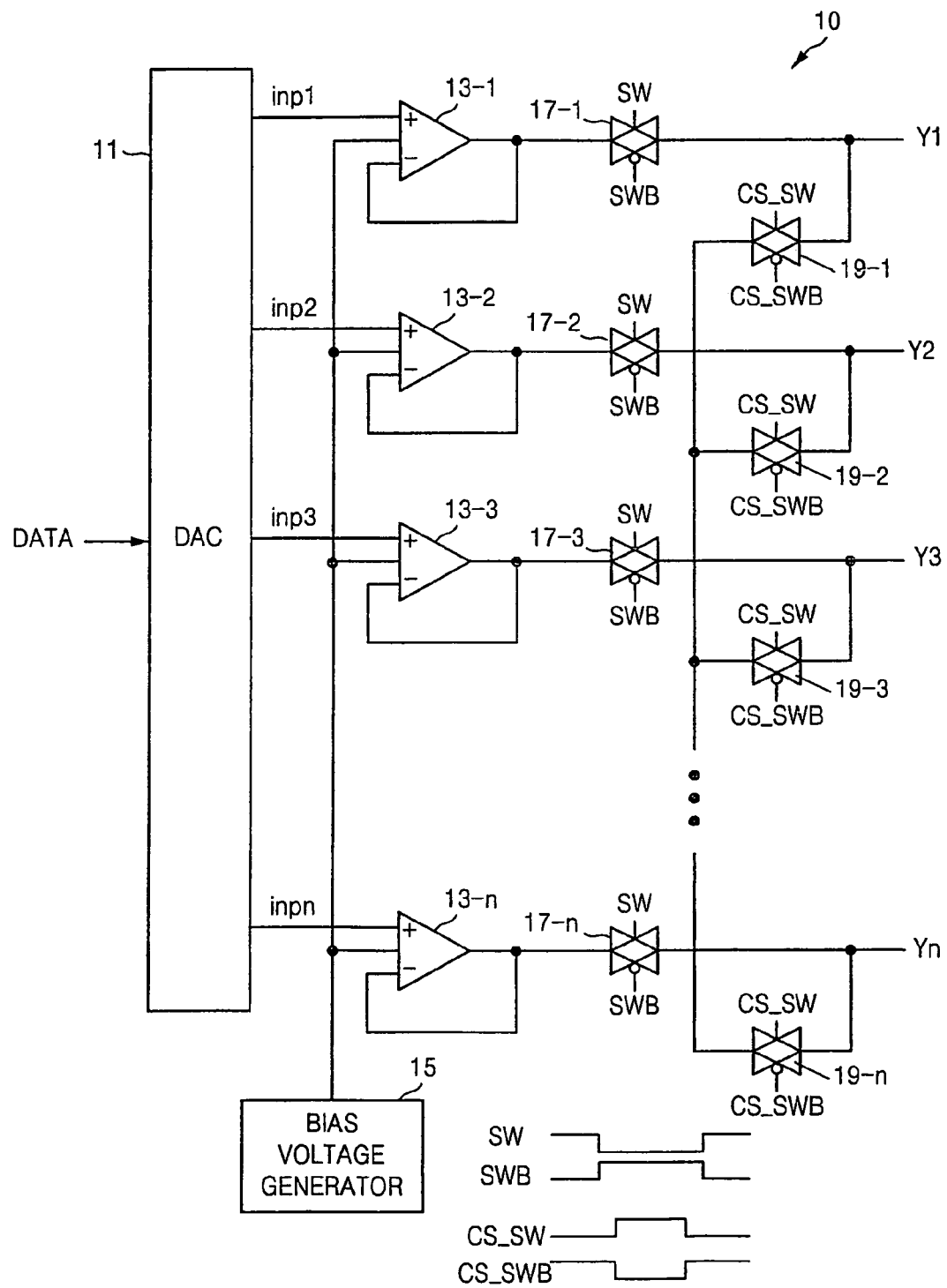
FIG. 1 is a circuit diagram showing an output portion of a general display driving device in accordance with the prior art.

Referring to FIGS. 1 and 3, the output portion 200 of FIG. 3, unlike the output portion 100 of FIG. 1, does not include a transmission gate, for example, the first transmission switches 17-1, 17-2, 17-3, . . . , 17-$n$, between each of the buffers 100-1, 100-2, 100-3, . . . , and 100-$n$ and each of the data lines Y1, Y2, Y3, . . . , Yn.

Thus, the layout area of the output portion 200 according to the present embodiment is smaller than that of the output portion 100 according to the conventional technology. As a result, the layout area of the display driving device is reduced. The differential amplifier according to the present embodiment has an effect of preventing waste of power. Also, the display device having the differential amplifier according to the present embodiment not only prevents waste of power, but also reduces the layout area.

While aspects of this invention have been particularly shown and described with reference to preferred embodiments in accordance therewith, it will be understood by those skilled in the art that various changes in form and details may be made therein without departing from the spirit and scope of the invention as defined by the appended claims. It is intended by the following claims to claim that which is literally described and all equivalents thereto, including all modifications and variations that fall within the scope of each claim.

What is claimed is:

1. A differential amplifier comprising:
   an input circuit configured to generate first differential currents and second differential currents in response to a voltage difference between differential input signals;
   an output circuit including a first transistor connected between a first voltage rail and an output port and a second transistor connected between the output port and a second voltage rail;
   a current summing circuit including a first control node configured to output a first control voltage to control a current flowing in the first transistor in response to the first differential currents and a second control node configured to output a second control voltage to control a current flowing in the second transistor in response to the second differential currents; and
   a switch circuit connecting a gate of the first transistor to one of the first control node and the first voltage rail and a gate of the second transistor to one of the second control node and the second voltage rail, in response to a control signal, wherein the switch circuit comprises:
   a first switch configured to control a connection between the first control node and the gate of the first transistor in response to the control signal;
   a second switch configured to control a connection between the second control node and the gate of the second transistor in response to the control signal;
   a third switch configured to control a connection between the first voltage rail and the gate of the first transistor in response to the control signal; and
   a fourth switch configured to control a connection between the second voltage rail and the gate of the second transistor in response to the control signal.

2. The differential amplifier of claim 1, wherein each of the first and second switches is a transmission gate.

3. The differential amplifier of claim 1, wherein the third switch is a PMOSFET and the fourth switch is an NMOSFET.

4. The differential amplifier of claim 1, wherein, in response to the control signal, the switch circuit
   connects between the gate of the first transistor and the first control node and between the gate of the second transistor and the second control node, during an amplification operation, in response to the control signal, and
   connects between the gate of the first transistor and the first voltage rail and between the gate of the second transistor and the second voltage rail, during a charge sharing operation.

5. The differential amplifier of claim 1, wherein the current summing circuit comprises:
   a first cascode current mirror connected between the first voltage rail and the first control node; and
   a second cascode current mirror connected between the second voltage rail and the second control node.

6. The differential amplifier of claim 5, further comprising:
   a first compensation capacitor connected between the output node of the output circuit and a first node of the first cascade current mirror to which one of the first differential currents is supplied; and
   a second compensation capacitor connected between the output node of the output circuit and a second node of the second cascade current mirror to which one of the second differential currents is supplied.

7. The differential amplifier of claim 1, further comprising a bias circuit that is connected between the first and second control nodes and configured to determine a static current of each of the first and second transistors.

8. A display driving circuit comprising:
   a plurality of unit gain amplifiers; and
   a plurality of charge sharing switches, each of the charge sharing switches configured to control a connection output port of the plurality of the unit gain amplifiers in response to a charge sharing control signal,
   wherein each of the unit gain amplifiers comprises:
   an input circuit including a first differential amplifier configured to generate first differential currents corresponding to a voltage difference between input signals and a second differential amplifier configured to generate second differential currents corresponding to the voltage difference;
   an output circuit including a first transistor connected between a first voltage rail and an output port thereof and a second transistor connected between the output port and a second voltage rail;
   a current summing circuit including a first control node configured to output a first control voltage to control a current flowing in the first transistor in response to the first output currents and a second control node configured to output a second control voltage to control a current flowing in the second transistor in response to the second output currents; and
   a switch circuit configured to connect a gate of the first transistor to one of the first control node and the first voltage rail and a gate of the second transistor to one of the second control node and the second voltage rail in response to a control signal wherein the switch circuit comprises:
   a first switch configured to control a connection between the first control node and the gate of the first transistor in response to the control signal;
   a second switch configured to control a connection between the second control node and the gate of the second transistor in response to the control signal;
   a third switch configured to control a connection between the first voltage rail and the gate of the first transistor in response to the control signal; and
   a fourth switch configured to control a connection between the second voltage rail and the gate of the second transistor in response to the control signal.

9. The display driving circuit of claim 8, wherein, in response to the control signal, the switch circuit
   connects between the gate of the first transistor and the first control node and between the gate of the second transistor and the second control node, during an amplification operation, and
   connects between the gate of the first transistor and the first voltage rail and between the gate of the second transistor and the second voltage rail, during a charge sharing operation.

* * * * *